(12) United States Patent
Iriguchi (10) Patent No.: US 7,923,293 B2
(45) Date of Patent: Apr. 12, 2011

(54) METHOD FOR MANUFACTURING A SEMICONDUCTOR DEVICE WHEREIN THE ELECTRICAL CONNECTION BETWEEN TWO COMPONENTS IS PROVIDED BY CAPILLARY PHENOMENON OF A LIQUID CONDUCTOR MATERIAL IN A CAVITY THEREBETWEEN

(75) Inventor: Chiharu Iriguchi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 522 days.

(21) Appl. No.: 12/019,958

(22) Filed: Jan. 25, 2008

(65) Prior Publication Data

US 2008/0179759 A1    Jul. 31, 2008

(30) Foreign Application Priority Data

Jan. 30, 2007    (JP) .................. 2007-018917

(51) Int. Cl.
*H01L 21/60* (2006.01)
*H01L 29/786* (2006.01)

(52) U.S. Cl. . 438/108; 438/119; 438/456; 257/E21.511; 257/E21.514

(58) Field of Classification Search .................. 438/108, 438/109, 119, 456, 459; 257/E21.511, E21.514
See application file for complete search history.

(56) References Cited

FOREIGN PATENT DOCUMENTS

| JP | A-11-24106 | 1/1999 |
| JP | A-2005-158776 | 6/2005 |
| JP | A-2005-277277 | 10/2005 |
| JP | A 2005-302813 | 10/2005 |
| JP | A-2005-308832 | 11/2005 |
| JP | A-2006-319016 | 11/2006 |

*Primary Examiner* — Anh D Mai
(74) *Attorney, Agent, or Firm* — Oliff & Berridge PLC

(57) ABSTRACT

A method for manufacturing a semiconductor device includes: (a) transferring an electronic component that has an electrode and formed on a first substrate from the first substrate to a second substrate; and (b) forming a wiring line electrically coupling the electrode and a terminal on the second substrate. A cavity is provided between the electrode of the electronic component transferred on the second substrate and the second substrate, and the wiring line is formed in the cavity.

5 Claims, 8 Drawing Sheets

LASER

METHOD FOR MANUFACTURING A SEMICONDUCTOR DEVICE WHEREIN THE ELECTRICAL CONNECTION BETWEEN TWO COMPONENTS IS PROVIDED BY CAPILLARY PHENOMENON OF A LIQUID CONDUCTOR MATERIAL IN A CAVITY THEREBETWEEN

The entire disclosure of Japanese Patent Application No. 2007-018917, filed Jan. 30, 2007 is expressly incorporated by reference herein.

BACKGROUND

1. Technical Field

The present invention relates to a method for manufacturing a semiconductor device, a semiconductor device, an electro-optical device, and an electronic apparatus.

2. Related Art

Several methods for forming a metal wiring line are known that electrically connect an external connection electrode of an electronic component and a terminal of a substrate in a semiconductor device in which the electronic component, such as thin film transistor (TFT), is mounted on the substrate. Examples of the methods include a connecting method with metal fine wires by wire bonding, and a wiring forming method with a liquid metal by using an inkjet method.

The wiring forming method needs to form wiring lines with stable electrical connections since a step is often formed between an external connection electrode of an electronic device and a terminal of a substrate. JP-A-2005-302813 discloses that such step is covered with an insulating resin to turn the step into a gentle slope, for example.

The method disclosed in JP-A-2005-302813, however, needs a process to cover the step with the insulating resin so as to make it a gentle slope.

SUMMARY

An advantage of the invention is to improve the stability of electrical connection between an electronic component and a wiring line of a semiconductor device without making manufacturing processes cumbersome.

According to a first aspect of the invention, a method for manufacturing a semiconductor device includes: (a) transferring an electronic component that has an electrode and formed on a first substrate from the first substrate to a second substrate; and (b) forming a wiring line electrically coupling the electrode and a terminal on the second substrate. A cavity is provided between the electrode of the electronic component transferred on the second substrate and the second substrate, and the wiring line is formed in the cavity.

According to the method, the cavity is disposed between the mounting substrate and the external connection electrode and the wiring line can be formed in the cavity. If the cavity is not formed, the wiring line needs to make contact with the side surface or the upper surface of the external connection electrode. In case of the side surface contact, the electrical connection is not stably maintained due to a small contacting area between the external connection electrode and the wiring line. In case of the upper surface contact, a step between the mounting substrate and the electrode needs to be buried. In the aspect, since the external connection electrode makes contact with the wiring line with its surface facing the cavity, the step between the electrode on the mounting substrate and the external connection electrode need not be buried. In addition, the external connection electrode and the wiring line can be contacted with a large area, allowing the stability of the electrical connection to be improved.

In step (b), a liquid material containing a conductive material is preferably coated on the second substrate, and the liquid material flows into the cavity by a capillary phenomenon.

As a result, the material is simply and reliably applied, allowing a wiring line having highly stable electrical connection to be formed.

In the step (b), the liquid material is preferably coated by using an inkjet method.

In the step (b), a hydrophobic treatment is preferably performed to a region, which does not face the cavity, of the second substrate so as to increase hydrophobicity of the region with respect to the liquid material.

As a result, the material does not spread on the surface of the mounting substrate, allowing the material to reliably fill the cavity.

The method may further include (c) removing the first substrate from the electronic component after the first substrate is irradiated with light, between step (a) and the step (b). As a result, the first substrate can be easily removed.

According to a second aspect of the invention, a method for manufacturing a semiconductor device includes (d) providing an electronic component to a second substrate, and (e) forming a wiring line electrically coupling an electrode of the electronic component and a terminal of the second substrate by coating a liquid material containing a conductive material. The electronic component includes at least a first insulation film, a second insulation film, and the electrode. The electrode includes a first portion and a second portion. The first portion is disposed between the first insulation film and the second insulation film, and the second portion does not overlap the second insulation film. In step (d), the second insulation film is bonded to the second substrate with an adhesive, and a cavity is formed between the second portion and the second substrate, and is filled with the liquid material in step (e).

This method allows the wiring line to be formed inside the cavity since the liquid material flows into the cavity by a capillary phenomenon. As a result, the contact area between the wiring line and the electrode of an electronic component increases, reducing failures, such as a poor contact.

According to a third aspect of the invention, a semiconductor device includes: a substrate on which a terminal is disposed; a first insulation film; an electrode that has a first portion and a second portion, and is disposed between the substrate and the first insulation film; and a wiring line that is disposed between the substrate and the second portion, and is electrically coupled to the electrode. The wiring line electrically couples the terminal and the electrode, and makes contact with the second insulation film.

If the wiring line is not formed between the external connection electrode of an electronic component and the substrate, unlike the aspect, the wiring line needs to make contact with the side surface or the upper surface of the external connection electrode. In case of the side surface contact, the electrical connection is not stably maintained due to a small contacting area between the external connection electrode and the wiring line. In case of the upper surface contact, a step between the substrate and the electrode needs to be buried. In the aspect, since the wiring line is formed between the external connection electrode and the substrate, the step between the electrode on the substrate and the external connection electrode need not be buried. In addition, the external connection electrode and the wiring line can be contacted with a large area, allowing the stability of the electrical connection to be improved.

According to a fourth and a fifth aspects of the invention, an electro-optical device and an electronic apparatus include the semiconductor device of the above aspects. The electro-optical device here is, for example, a device provided with a liquid crystal element, an electrophoretic element including dispersion medium in which an electrophoretic particle is dispersed, an EL element, and the like. In the device, the semiconductor device of the above aspects is applied to the driving circuit and the like. The electronic apparatus includes apparatuses that are provided with the semiconductor device of the above aspects and perform specific functions. The apparatuses are provided with electro-optical devices and memories, for example. The structure is not particularly limited. The examples include IC cards, cellular phones, video cameras, personal computers, head-mount displays, facsimiles with a display function, digital camera finders, portable TVs, DSP devices, PDAs, electronic organizers, electric signboards, and commercial displays.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will be described with reference to the accompanying drawings.

First Embodiment

As a first embodiment of the invention, a method for manufacturing a semiconductor device 10 will be described with reference to FIGS. 1A to 7B.

Figure 1A:
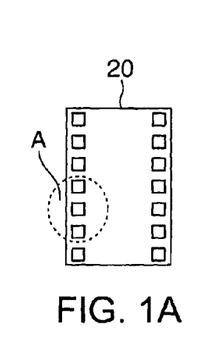
FIGS. 1A to 1C are views schematically illustrating the structure of a thin film chip mounted to the semiconductor device.
Figure 1B:
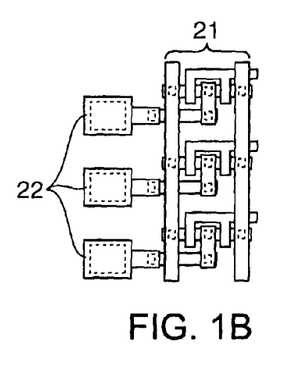
Figure 1C:
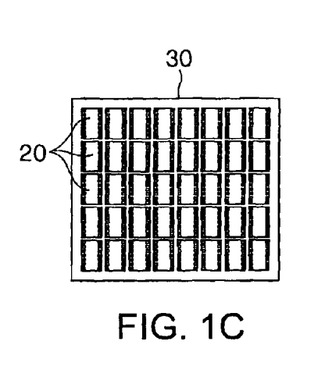

FIG. 1A is a view schematically illustrating the structure of a thin film chip (an electronic component) 20 mounted to the semiconductor device 10. FIG. 1B is an enlarged view of part A of FIG. 1A. As shown in FIG. 1B, the thin film chip 20 is provided with an electronic device part 21 and an external connection electrode 22. The number of external connection electrodes is one or more. The thin film chip 20 is fabricated on a thin film chip fabrication substrate (a first substrate) 30 as shown in FIG. 1C. In general, the thin film chip 20 is fabricated on the thin film chip fabrication substrate 30 in a plurality of numbers. The thin film chip 20 is transferred on a substrate (a second substrate) of the semiconductor device 10 from the thin film fabrication substrate 30, and then a wiring line is formed that electrically couples the thin film chip 20 and a terminal on the substrate. As a result, the semiconductor device 10 is achieved.

Figure 2A:
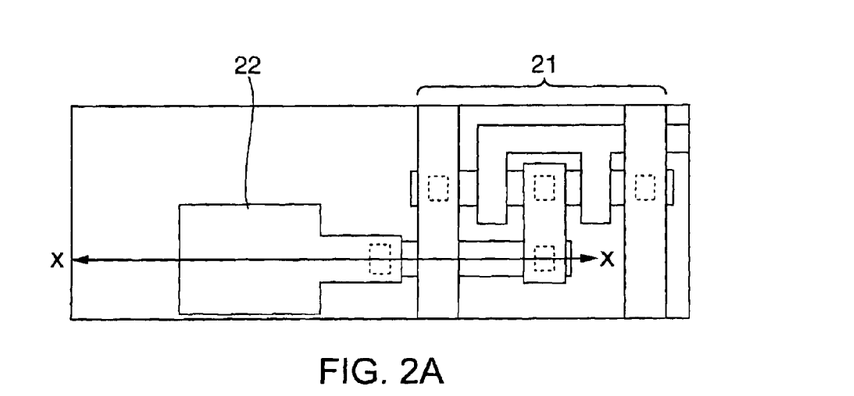
FIG. 2A is a plan view of the thin film chip of a first embodiment of the invention.
Figure 2B:
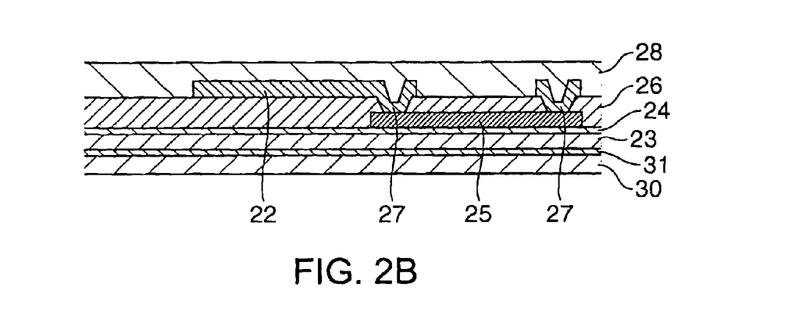
FIG. 2B is a sectional view taken along the line X-X of FIG. 2A.

FIG. 2A is a plan view illustrating the structure the electronic device part 21 and the external connection electrode 22 of the thin film chip 20 fabricated on the thin film fabrication substrate 30. FIG. 2B is a sectional view (taken along the line X-X of FIG. 2A) illustrating the section of the external connection electrode 22. The thin film chip fabrication substrate 30 is a glass substrate, for example. The thickness is preferably from 0.5 mm to 0.7 mm. Between the thin film chip fabrication substrate 30 and the thin film chip 20, provided is a separation layer (ablation layer) 31. The separation layer 31 is formed with amorphous silicon, for example. The thickness is preferably about 100 nm.

On the separation layer 31, formed is an underlayer insulation film (a silicon dioxide film) 23. The preferable thickness of the underlayer insulation film 23 is about 500 nm. On the underlayer insulation film 23, formed is a gate insulation film (a silicon dioxide film) 24 having a thickness of about 50 nm. On the gate insulation film 24, formed is a gate wiring line 25 made of tantalum of a thickness of about 500 nm. An interlayer insulation film (a silicon dioxide film) 26 is formed with a thickness of about 800 nm. A source/drain wiring line 27 is made of aluminum and is formed with a thickness of about 900 nm. As shown in FIG. 2B, the external connection electrode 22 is integrated with the source/drain wiring line 27. A passivation film 28 is made of a photosensitive acrylic resin with a thickness of about 2 μm so as to cover the source/drain wiring line 27 and the external connection electrode 22.

Figure 3A:
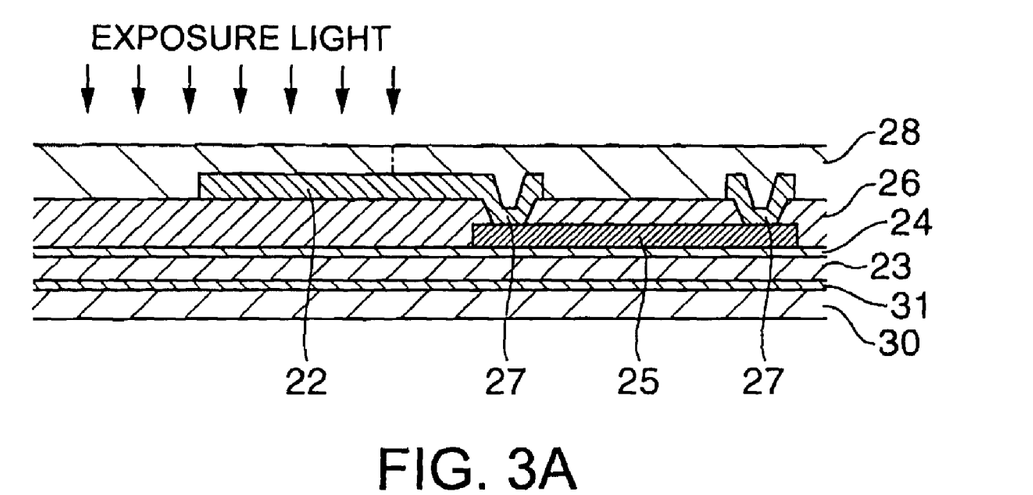
FIGS. 3A and 3B are views illustrating an opening of an external connection electrode of the thin film chip.
Figure 3B:
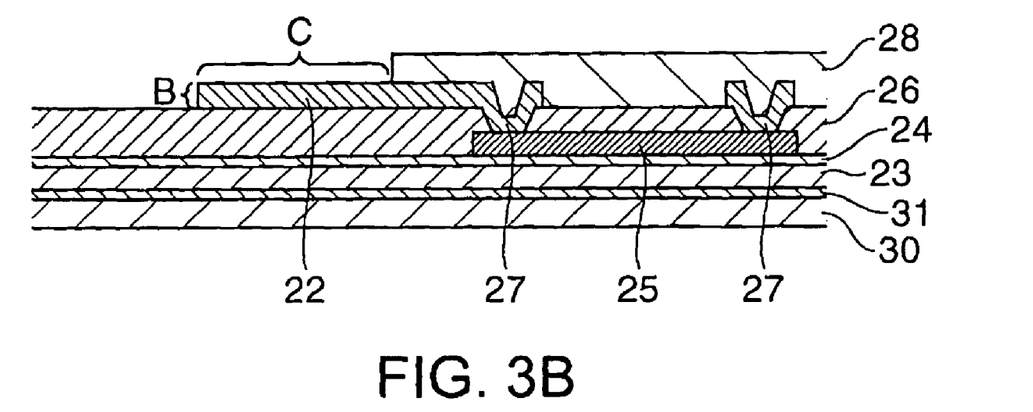

Next, part of the passivation film 28 covering the external connection electrode 22 is removed to exposure part of the external connection electrode 22, as shown in FIGS. 3A and 3B.

FIGS. 3A and 3B are sectional views (taken along the line X-X of FIG. 2A) illustrating the section of the thin film chip 20.

First, as shown in FIG. 3A, the external connection electrode 22 is exposed by an exposure apparatus, such as a stepper and an aligner, over the passivation film 28. As a light source, the line (of 365 nm wavelength) of a mercury lamp can be used, for example. As shown in FIG. 3B, development, after the exposure, removes the passivation film 28 covering the external connection electrode 22 to expose the side surface (shown as B in FIG. 3B) and the surface (shown as C in FIG. 3B) of the external connection electrode 22.

Next, the thin film chip 20 fabricated in a plurality of numbers on the thin film chip fabrication substrate 30 is individually separated.

Figure 4A:
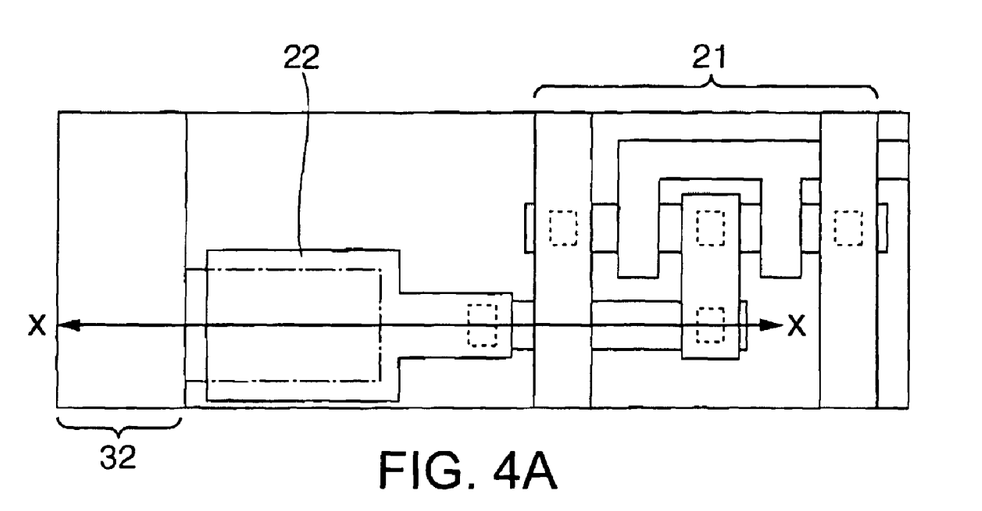
FIGS. 4A and 4B are views illustrating the separation of the thin film chips.
Figure 4B:
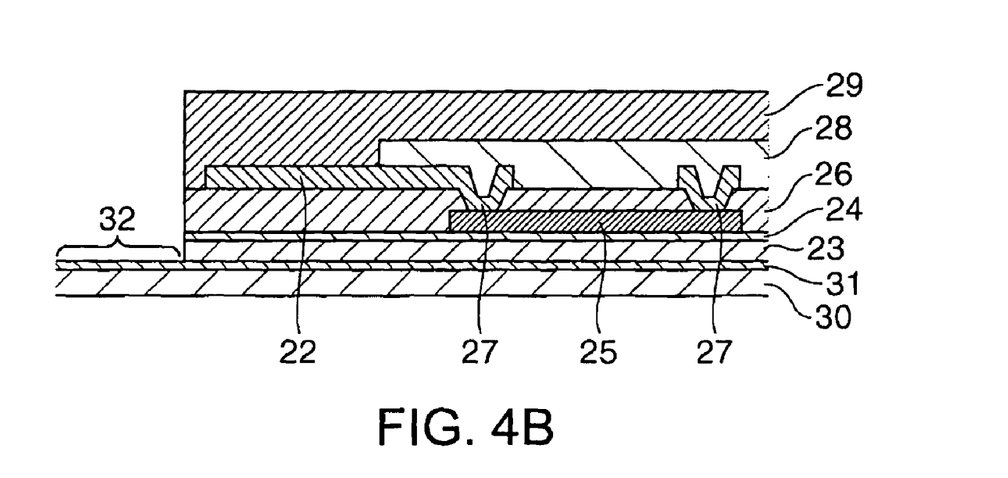

This separation will be described with reference to FIGS. 4A and 4B. FIG. 4A is a plan view of the thin film chip 20. FIG. 4B is a sectional view (taken along the line X-X of FIG. 4A) of the thin film chip 20.

First, a photoresist 29 is formed on the passivation film 28, and then it is patterned so as to open a chip separation portion 32. Next, the chip separation portion 32 is removed by anisotropic etching with reactive ion etching using $CF_4$ plasma. As a result, as shown in FIG. 4B, the separation layer 31 in the chip separation portion 32 is exposed. The exposed separation layer 31 separates the thin film chips 20 adjacent each other.

Next, the thin film chip 20 is transferred to the semiconductor device 10.

Figure 5A:
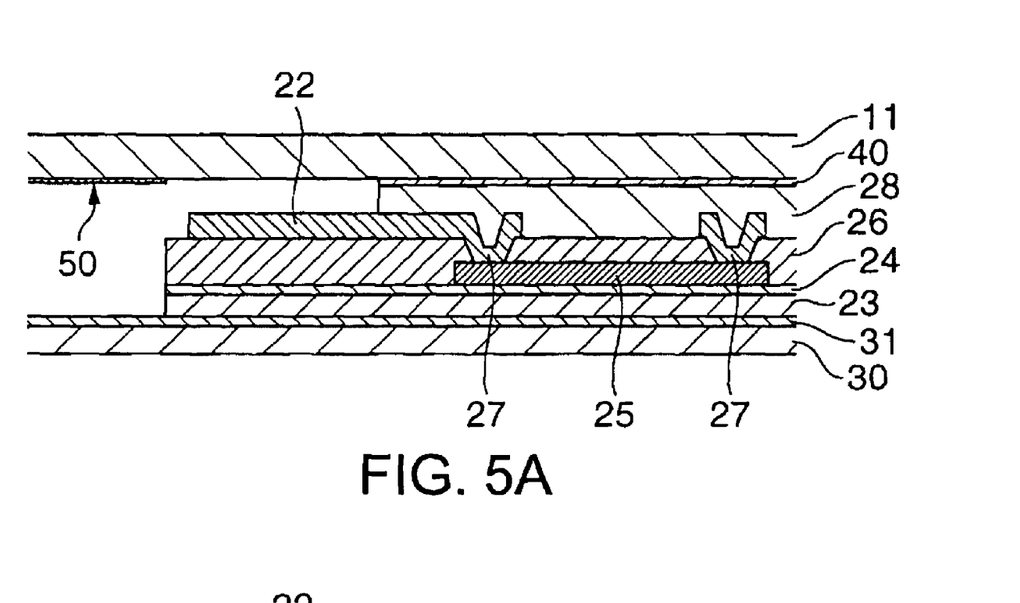
FIGS. 5A and 5B are views illustrating the transfer of the thin film chip.
Figure 5B:
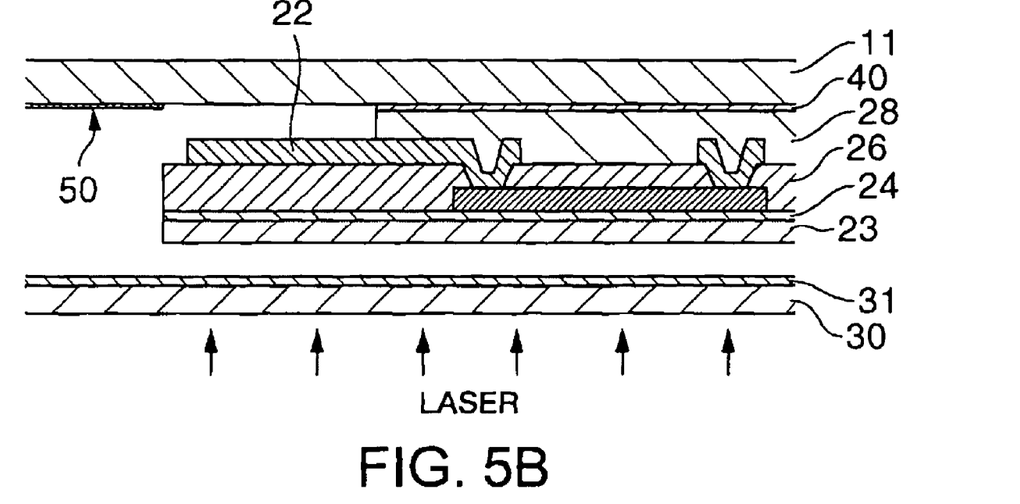

This transfer will be described with reference to FIGS. 5A to 6B. FIGS. 5A and 5B are sectional views (taken along the line X-X of FIG. 4A) of the thin film chip 20.

First, the surface of a substrate 11 of the semiconductor device 10 is subjected to a hydrophobic treatment by which the surface is given increased hydrophobicity with respect to a liquid material coated thereon in a later process. As an example of the hydrophobic treatment, a self-assembled film 50 is formed on the surface of the substrate 11 to give hydrophobicity to the surface. The self-assembled film 50 can be formed by using fluoroalkylsilane (FAS), for example. After the self-assembled film 50 is formed on the substrate 11, two regions of the self-assembled film 50 are irradiated with ultraviolet rays so as to give hydrophilicity to the regions by disenabling the function of the self-assembled film 50 in the regions. The two regions are as follows: one region that the external connection electrode 22 faces, and the other region to which the thin film chip 20 bonds, when the thin film chip 20 is bonded to the substrate 11.

Next, as shown in FIG. 5A, a thermoset adhesive 40 is coated to the substrate 11 of the semiconductor device 10 by using serene printing or the like. Then, the substrate 11 is bonded to the passivation film 28 of the thin film chip 20. After the bonding, the adhesive 40 is cured by a heat treatment (at 80 degrees centigrade, for 30 minutes).

Next, as shown in FIG. 5B, the backside of the thin film chip fabrication substrate 30 is irradiated with a laser beam. In this case, a laser beam having a wavelength of 308 nm by using a XeCl excimer laser apparatus. The irradiated laser beam lowers the adhesive strength of the separation layer 31, allowing the thin film chip 20 to be easily peeled off from the thin film chip fabrication substrate 30.

Figure 6A:
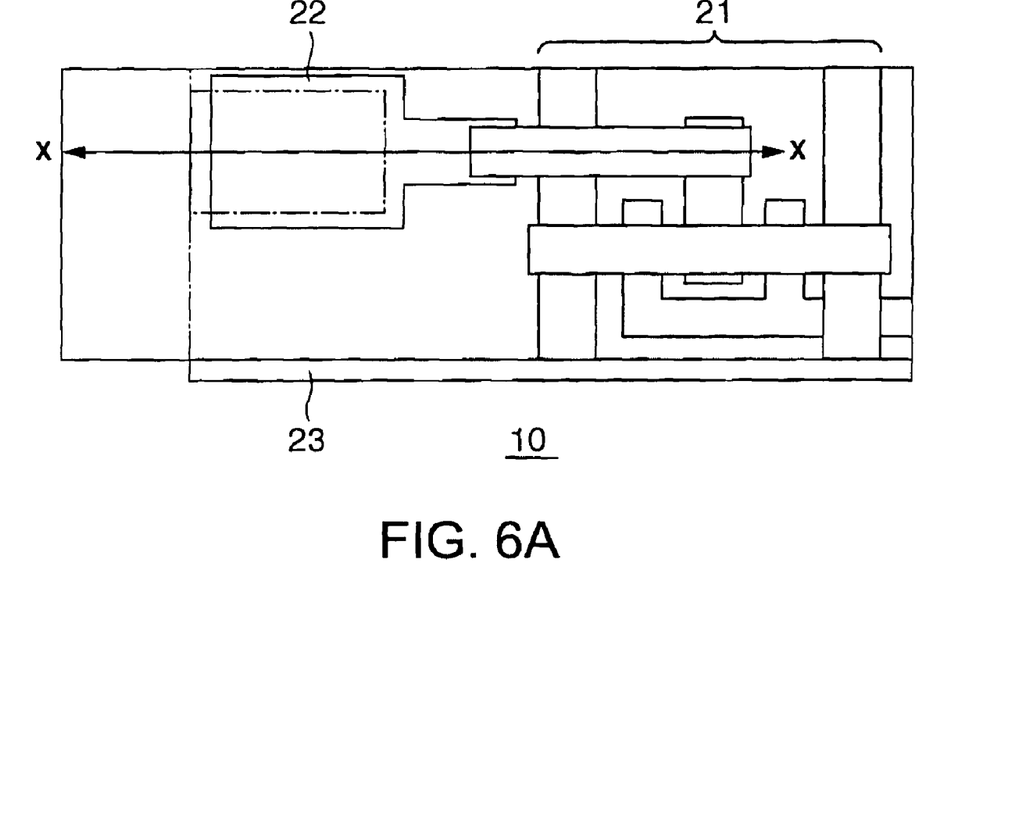
FIGS. 6A and 6B are views illustrating the transfer of the thin film chip.
Figure 6B:
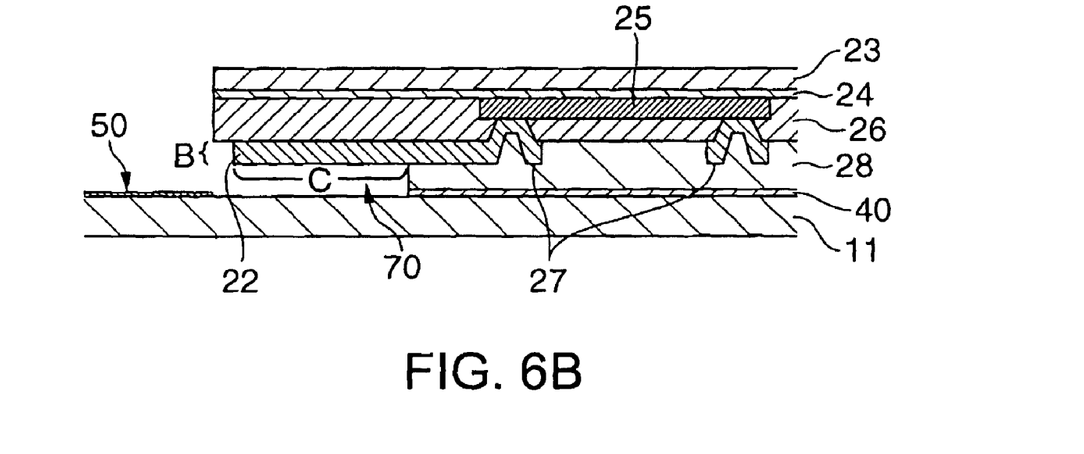

FIGS. 6A and 6B illustrate a state in which the thin film chip 20 is disposed on the substrate 11 of the semiconductor device 10. FIG. 6A is a plan view of the thin film chip 20 disposed on the substrate 11. FIG. 6B is a sectional view taken along the line X-X of FIG. 6A. As shown in FIG. 6B, the thin film chip 20 is bonded to the substrate 11 with the thermoset adhesive 40 interposed therebetween so that the passivation film 28 faces the substrate 11. As shown in FIG. 6B, a cavity 70 is formed between the external connection electrode 22 and the substrate 11 since the side surface and the surface of the external connection electrode 22 are exposed as shown in FIG. 3B. The side surface is shown as B while the surface is shown as C in FIG. 3B.

Next, a wiring line is formed that couples the external connection electrode 22 of the thin film chip 20 and an electrode on the substrate 11.

Figure 7A:
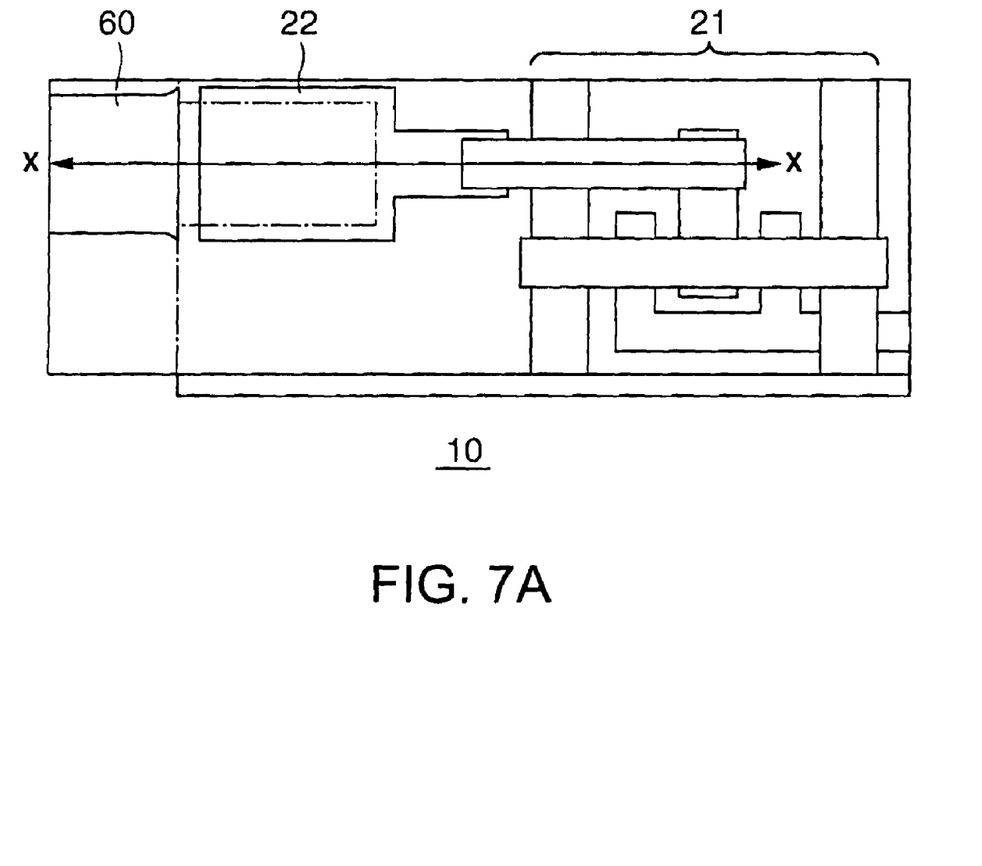
FIGS. 7A and 7B are views illustrating the formation of a wiring line.
Figure 7B:
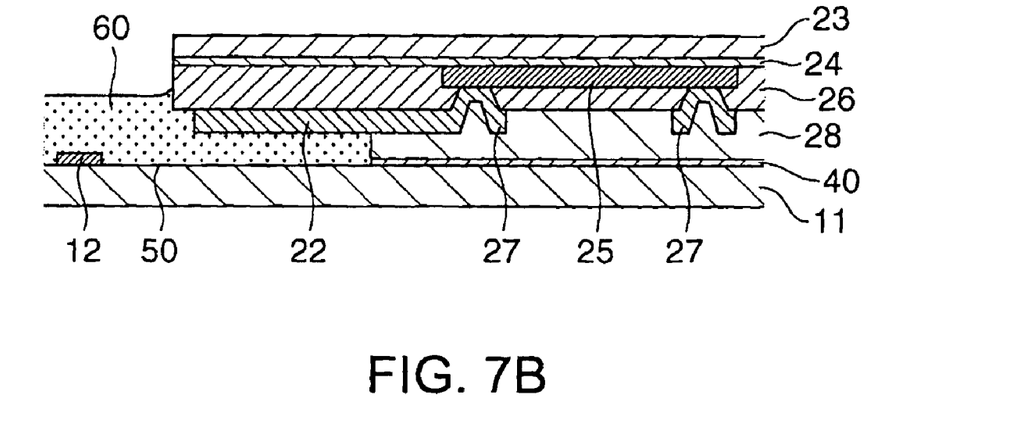

The forming of the wiring line will be described with reference to FIGS. 7A and 7B. FIG. 7A is a plan view of the thin film chip 20 disposed on the substrate 11. FIG. 7B is a sectional view taken along the line X-X of FIG. 7A.

A liquid material containing a conductive material is discharged on the substrate 11 by using an inkjet method. The discharged liquid material flows into the cavity 70 formed between the external connection electrode 22 and the substrate 11 by a capillary phenomenon. The discharged liquid material is surely supplied to the cavity 70 without spreading on the substrate 11 since the self-assembled film 50 is formed on a region, which does not face the external connection electrode 22, of the substrate 11. As an example of the liquid material, a solvent, such as tetradecane, in which conductive fine particles of a conductive material, such as Au, Ag, and Cu, having a size of about 10 nm are dispersed, can be used. The conductive material, however, is not limited to such material. One includes a conductive organic material, such as PEDOT/PSS, can be used. The liquid material may be coated by dropping using dispenser other than an inkjet method.

After coating, the material is heated to remove the solvent, forming a wiring line 60. As shown in FIG. 7B, the external connection electrode 22 makes contact with the wiring line 60 with its side surface (shown as B in FIG. 6B) and the surface (shown as C in FIG. 6B).

In the embodiment, part of the passivation film 28 covering the external connection electrode 22 is removed in advance so as to form the cavity 70 between the substrate 11 of the semiconductor device 10 and the external connection electrode 22. This structure allows a liquid material to flow into the cavity 70 by a capillary phenomenon, forming the wiring line 60 between the external connection electrode 22 and the substrate 11. When the cavity 70 is not formed, the external connection electrode 22 needs to make contact with the wiring line 60 by the following manner. That is, the external connection electrode 22 makes contact with the wiring line 60 only with its side surface, or with its upper surface facing the interlayer insulation film 26 by removing each of the interlayer insulation film 26, the gate insulation film 24, and the underlayer insulation film 23, which cover the external connection electrode 22. In case of only the side surface contact, the electrical connection is not stably maintained due to a small contacting area between the external connection electrode 22 and the wiring line 60. In a case where the upper surface, the exposed surface opposing the substrate 11, of the external connection electrode 22 is contacted, a step between a terminal 12 on the substrate 11 and the surface needs to be buried. In the embodiment, since the external connection electrode 22 makes contact with the wiring line 60 with its side surface (shown as B in FIG. 6B) and the surface (shown as C in FIG. 6B), the step between the terminal 12 on the substrate 12 and the external connection electrode 22 need not be buried. In addition, the external connection electrode 22 and the wiring line 60 can be contacted with a large area, allowing the stability of the electrical connection to be improved. Further, the device can be made in a low profile. Here, the wiring line 60 makes contact with the terminal 12 on the substrate 11.

Electro-Optical Device

Figure 8:
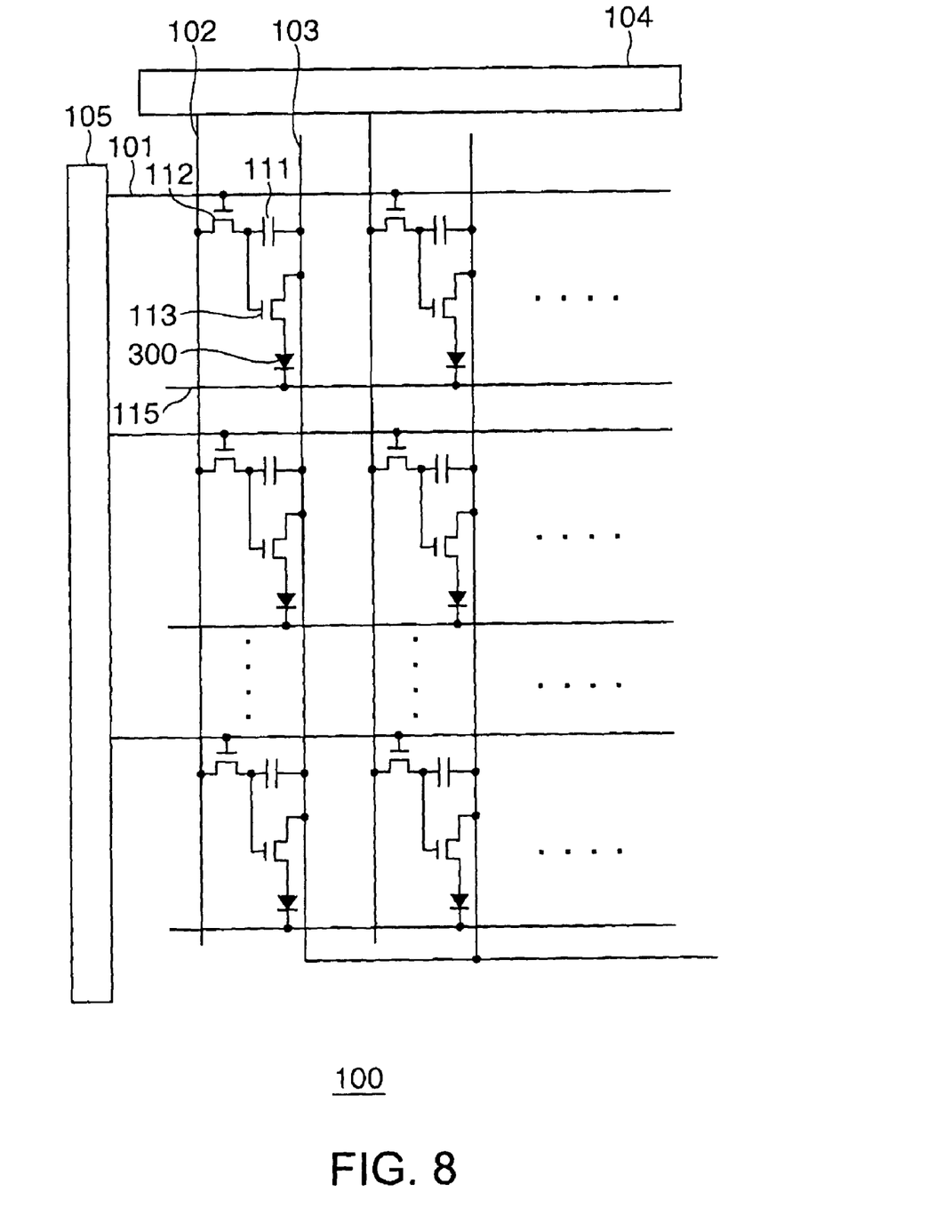
FIG. 8 is a circuit diagram of an organic EL device, an example of an electro-optical device according to the invention.

FIG. 8 is a circuit diagram of an organic EL device 100, an example of an electro-optical device of the invention. The organic El device 100 includes a plurality of scan lines 101, a plurality of signal lines 102, each of which is perpendicular to each of the scan lines 101, a plurality of power lines 103, each of which is in parallel with each of the signal lines 102, and a plurality of pixels A, each of which is disposed in the vicinity of each intersection of the scan line 101 and the signal line 102. That is, the organic EL device 100 is an active matrix type display, which includes the pixels A arranged in a matrix.

A scan line driving circuit 105 including a shift register and a level shifter is connected to each scan line 101. A data line driving circuit 104 including a shift register, a level shifter, a video line and an analog switch is connected to each signal line 102. Each pixel A is provided with a switching transistor 112 to the gate of which a scan signal is supplied through the scan line 101, a capacitor 111 that retains a pixel signal supplied from the signal line 102 through the switching transistor 112, a driving transistor 113 to the gate of which the pixel signal retained by the capacitor 111 is supplied, a pixel electrode (anode) into which a driving current flows from the power line 103 connected when it is electrically connected to the power line 103 through the driving transistor 113, and a luminescence function layer sandwiched between the pixel electrode and a counter electrode (cathode) facing the pixel electrode. An organic EL element 300 is composed of the pixel electrode, the counter electrode, and the luminescence function layer. The luminescence function layer includes a hole transportation layer, a luminescent layer, and an electron injection layer.

According to the organic EL device 100, when the scanning line 101 is driven to turn on the switching transistor 112, the potential of the signal line 102 is retained by the capacitor 111, and the on/off state of the driving transistor 113 is determined in accordance with the state of the capacitor 111. Current flows from the power line 103 to the pixel electrode through the channel of the driving transistor 113, and further to the cathode through the luminescence function layer. The luminescence function layer emits light in accordance with the current flowing through. Desired images can be displayed by controlling the luminescent condition of each luminescence function layer.

The semiconductor device 10 of the invention is used for the data line driving circuit 104 and the scan line driving circuit 105 of the organic EL device 100, for example.

Electronic Apparatus

Hereinafter, specific examples of an electronic apparatus provided with the organic EL device 100.

Figure 9A:
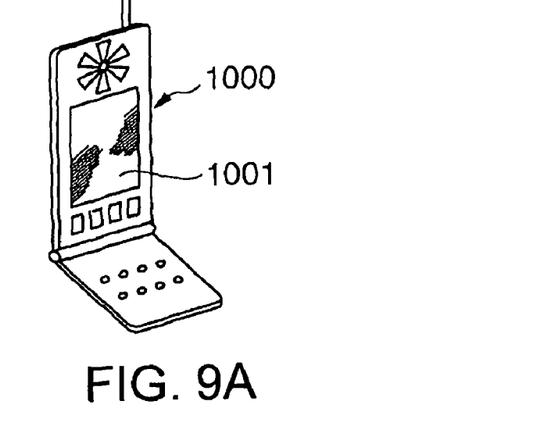
FIGS. 9A to 9C are views illustrating specific examples of an electronic apparatus according to the invention.
Figure 9B:
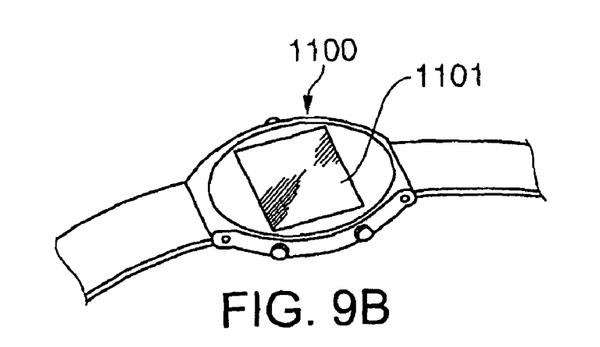
Figure 9C:
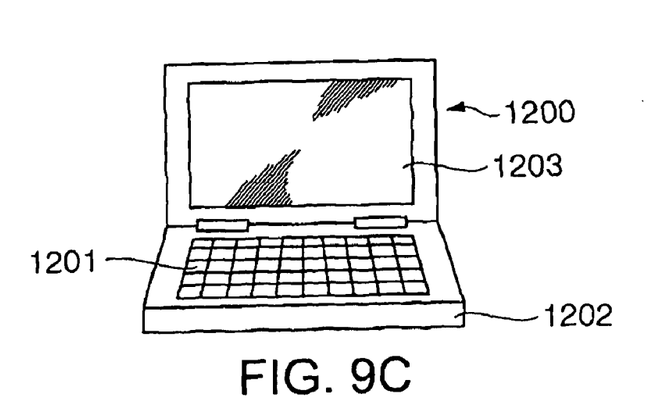

FIGS. 9A to 9C are perspective views illustrating specific examples of an electronic apparatus provided with the organic EL device 100. FIG. 9A is a perspective view illustrating a cellular phone as an example of the electronic apparatus. A cellular phone 1000 is provided with a display 1001 using the organic EL device 100 according to the invention. FIG. 9B is a perspective view illustrating a wristwatch as an example of the electronic apparatus. A wristwatch 1100 is provided with a display 1101 using the organic EL device 100 according to the invention. FIG. 9C is a perspective view illustrating a portable data processing device 1200 as an example of the electronic apparatus. The portable data processing device 1200 is provided with an input portion 1201, such as a key board, a body 1202 housing operation means and memory means or the like, and a display 1203 using the organic EL device 100 according to the invention.

What is claimed is:

1. A method for manufacturing a semiconductor device, comprising the steps of:
providing an electronic component to a second substrate;
bonding a second insulation film to the second substrate with an adhesive;
forming a wiring line electrically coupling an electrode of the electronic component and a terminal of the second substrate by coating a liquid material containing a conductive material,
wherein the electronic component includes:
at least a first insulation film,
a second insulation film, and
the electrode, wherein the electrode includes a first portion and a second portion, the first portion being disposed between the first insulation film and the second insulation film, and the second portion being exposed by the second insulation film,
forming a first portion of the wiring line between the electrode and the second substrate such that the first portion of the wiring line contacts opposing surfaces of the second substrate and the electrode; and
forming a second portion of the wiring line between the first insulation film and the second substrate such that the second portion of the wiring line contacts opposing surfaces of the first insulation film and the second substrate;
wherein the wiring line is formed by filing a cavity that is formed between the second portion and the second substrate with the liquid material.

2. The method for manufacturing a semiconductor device according to claim 1, wherein the step of forming the wiring line includes coating a liquid material containing a conductive material on the second substrate, the liquid material flowing into the cavity by a capillary phenomenon.

3. The method for manufacturing a semiconductor device according to claim 2, wherein the liquid material in the step of forming the wiring line is coated by using an inkjet method.

4. The method for manufacturing a semiconductor device according to claim 2, wherein the step of forming the wiring line further includes performing a hydrophobic treatment to a region of the second substrate so as to increase hydrophobicity of the region with respect to the liquid material and the region does not face the cavity.

5. The method for manufacturing a semiconductor device according to claim 1 further comprising the step of removing the first substrate from the electronic component after the first substrate is irradiated with light, wherein the step of removing the first substrate is performed between the step of transferring the electronic component and the step of forming the writing line.

* * * * *